(12) United States Patent
Theodoras, II

(10) Patent No.: US 7,945,164 B2
(45) Date of Patent: May 17, 2011

(54) MULTIPLE FIBER OPTIC GIGABIT ETHERNET LINKS CHANNELIZED OVER SINGLE OPTICAL LINK

(75) Inventor: James T. Theodoras, II, Plano, TX (US)

(73) Assignee: Cisco Technology, Inc., San Jose, CA (US)

( * ) Notice: Subject to any disclaimer, the term of this patent is extended or adjusted under 35 U.S.C. 154(b) by 1191 days.

(21) Appl. No.: 11/420,356

(22) Filed: May 25, 2006

(65) Prior Publication Data

US 2007/0274351 A1 Nov. 29, 2007

(51) Int. Cl.
*H04J 14/02* (2006.01)
(52) U.S. Cl. .................... 398/79; 398/72; 398/98
(58) Field of Classification Search ........... 398/66–72, 398/79, 98
See application file for complete search history.

(56) References Cited

U.S. PATENT DOCUMENTS

| | | | |
|---|---|---|---|
| 6,377,640 B2 * | 4/2002 | Trans | 375/354 |
| 6,430,201 B1 * | 8/2002 | Azizoglu et al. | 370/535 |
| 6,690,682 B1 | 2/2004 | Giaretta et al. | |
| 7,486,611 B1 * | 2/2009 | Wilson | 370/220 |
| 7,551,651 B1 * | 6/2009 | Yen | 370/537 |
| 2003/0067656 A1 * | 4/2003 | Gentile | 359/158 |
| 2003/0214979 A1 * | 11/2003 | Kang et al. | 370/535 |
| 2004/0136711 A1 * | 7/2004 | Finan et al. | 398/59 |
| 2004/0185887 A1 | 9/2004 | Wolman et al. | |
| 2004/0249964 A1 * | 12/2004 | Mougel | 709/231 |
| 2006/0029100 A1 | 2/2006 | Dove | |
| 2009/0073875 A1 * | 3/2009 | Kashyap | 370/228 |

OTHER PUBLICATIONS

PCT International Search Report dated Nov. 14, 2007.

* cited by examiner

*Primary Examiner* — Dzung D Tran
(74) *Attorney, Agent, or Firm* — Patterson & Sheridan, LLP

(57) ABSTRACT

A method, an apparatus, and a system where multiple lower bandwidth optic Ethernet (e.g. 1000Base-FX) signals can be interleaved or encoded onto a single fiber optic link by overclocking the physical layer elements in such a manner as to be transparent to the data link layer and other higher network layers in the Open Systems Interconnection Reference Model (OSI Model) are provided. Such embodiments may provide increased port density over the existing fiber optic gigabit Ethernet (GbE) standards. In embodiments where multiple GbE signals are not channelized, overclocking the physical layer elements may provide increased bandwidth for a single link over existing fiber optic GbE standards.

14 Claims, 3 Drawing Sheets

MULTIPLE FIBER OPTIC GIGABIT ETHERNET LINKS CHANNELIZED OVER SINGLE OPTICAL LINK

BACKGROUND OF THE INVENTION

1. Field of the Invention

Embodiments of the present invention generally relate to high speed network interfaces, and more particularly to gigabit Ethernet over fiber optics.

2. Description of the Related Art

One of the more recent developments in high speed networking has been gigabit Ethernet (GbE) over optical fibers as defined in the IEEE 802.3z standard, one example of which is 1000Base-FX. Able to provide 1 gigabit per second (Gbps) bandwidth in addition to the simplicity and available transmission distance of an optic Ethernet connection, GbE over fiber offers a smooth, seamless upgrade path for current 10Base-F or 100Base-FX Ethernet installations running at 10 megabits per second (Mbps) and 100 Mbps, respectively.

Despite the increased bandwidth of gigabit Ethernet, network switching integrated circuits (ICs) have grown in processing power faster than physical link elements (e.g. network cables and connectors), and thus, the switching capacity of linecards has outpaced faceplate densities. Because of this, the data switch on the linecard will be undersubscribed, and the unused bandwidth of the network IC will be wasted whenever the faceplate jacks on such a limited density linecard run out.

For example, the SPA-8X1GE, a GbE shared port adapter for use with the Cisco CRS-1 session initiation protocol (SIP), can hold 8 SFP hot-swappable optical modular transceivers operating at 1 gigabit each for a total faceplate bandwidth of 8 Gbps. SFP stands for small form factor pluggable and is a standard for a new generation of optical transceivers for use with LC connectors (miniature fiber optic cable connectors that use a push-pull latching mechanism) that offer high speed and physical compactness. Returning to the SPA-8X1GE, the linecard itself has a bandwidth of 10 Gbps, and the next generation will have a bandwidth of 20 Gbps. If only 8 Gbps is used because of the physical limitations of the faceplate, then the rest of the available bandwidth is wasted.

The basic conventional industry solution is the brute force approach of increased bandwidth per port, and 10 gigabit Ethernet (10 GbE) was offered as an answer. Even though 10 GbE does increase the faceplate density, it does not solve the issue of aggregating enough lower speed legacy links to fill the higher bandwidth ports. In addition, there are physical limitations that prevent 10 GbE transceivers from reaching the low price point that transceivers operating at 4 Gbps or lower enjoy.

Another approach to increasing the bandwidth without the additional cost of 10 GbE is to connect multiple 1 GbE links. However, these links are channelized at higher network layers with more complexity than the physical layer, and the router software may be very inefficient at managing all those links to replicate a single high-speed link. For example, one would think that five 1 GbE links should provide 400% more bandwidth when compared to a single link, as long as the system could support the cabling and information concatenation. However, in practice, due to routing overhead of higher layers, these five links may in reality only provide 50% more bandwidth.

Accordingly, what is needed is an optic gigabit Ethernet system that achieves greater connection density, preferably while still working efficiently within the boundaries of existing GbE standards, transceivers and cabling, while maintaining backwards compatibility.

BRIEF DESCRIPTION OF THE DRAWINGS

A more particular description of the invention may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide an optic high bandwidth (e.g., gigabit Ethernet) system where multiple lower bandwidth (e.g. 1000Base-FX) signals can be interleaved or encoded onto a single fiber optic link by overclocking the physical layer elements in such a manner as to be transparent to the data link layer and other higher network layers in the Open Systems Interconnection Reference Model (OSI Model). Such embodiments may provide increased port density over the existing fiber optic gigabit Ethernet (GbE) standards. In embodiments where multiple GbE signals are not channelized, overclocking the physical layer elements may provide increased bandwidth for a single link over existing fiber optic GbE standards.

Although embodiments of the invention may apply to any fiber optic Ethernet standards with data rates greater than or equal to 1 gigabit per second (Gbps), such as 1000Base-LX, 1000Base-SX, or 1000Base-FX, embodiments of the invention as they apply to the 1000Base-FX standard will be described henceforth as a specific example.

An Exemplary Multiple Channelized 1000Base-FX Architecture

Figure 1:
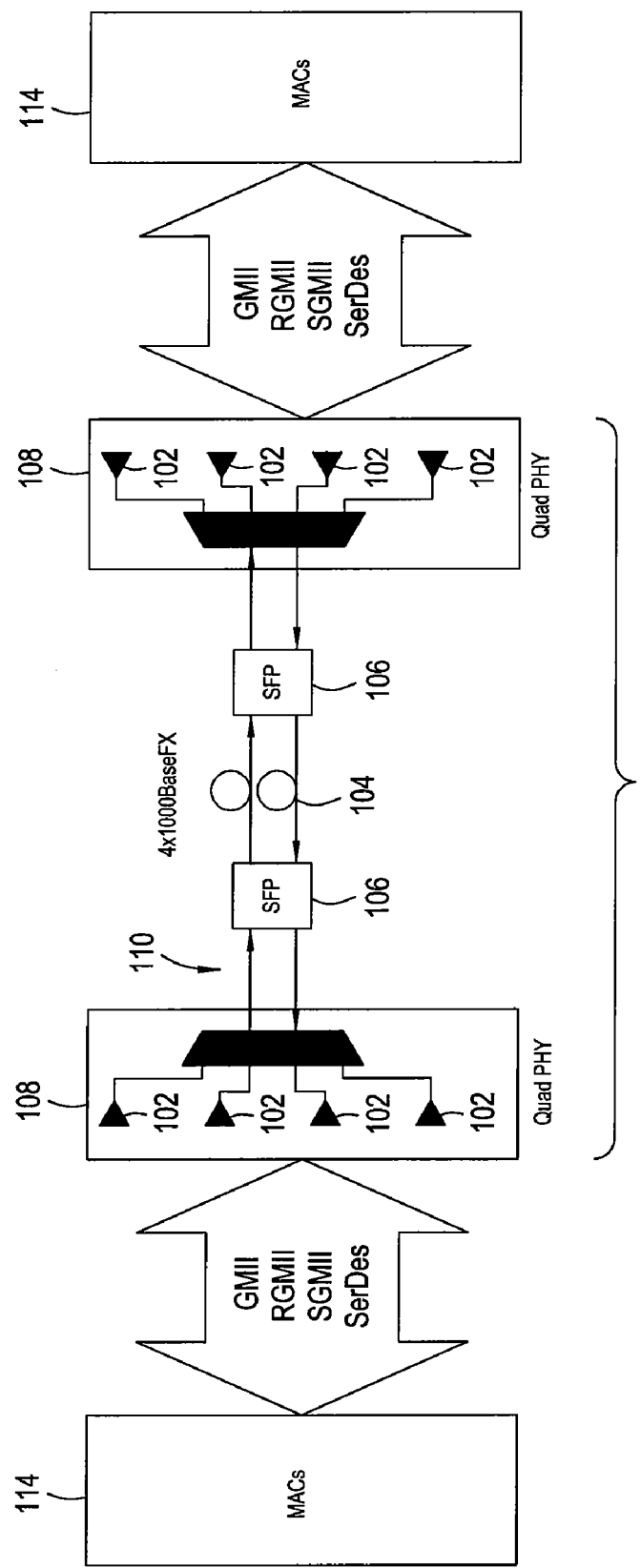
FIG. 1 is a block diagram of a multiple channelized GbE architecture illustrating four 1000Base-FX links channelized over a single fiber optic link according to one embodiment of the invention.

FIG. 1 is a block diagram of a multiple channelized GbE architecture illustrating four 1000Base-FX links 102 channelized over a single fiber optic link 104 according to one embodiment of the invention. For some embodiments, only two links may be channelized in this manner. As a brief overview of the architecture in FIG. 1, the fiber optic link 104 may be connected to an optical transceiver 106 on both ends for translating the transmitted optical signals into electrical signals. The optical transceivers 106 may be Small Form Factor Pluggable (SFP) modules.

The electrical signals from the optical transceiver 106 may be communicated to a physical layer integrated circuit (PHY) 108 where an electrical channelized link 110 may be separated back into its four constituent 1000Base-FX links 102. A physical layer 112 of a network may comprise the PHY ICs 108, the optical transceivers 106 and the fiber optic link 104.

The physical layer 112 may communicate with a data link layer 114 where data transmitted from network node to network node based on a Media Access Control (MAC) address may be divided into frames and validated.

In order to carry up to four 1000Base-FX links 102 on a single fiber optic link 104, the information may have to be transmitted at data rates up to four times faster than 1 Gbps. Those skilled in the art will know that optical fibers are capable of real-world data rates of at least 40 Gbps for significant distances, which surpass the 4 Gbps requirement by far, so the optical link 104 should be covered. Even though conventional gigabit Ethernet only requires data rates of 1 Gbps, SFP and other types of optical transceivers 106 designed for use with 1000Base-FX links 104 are already capable of 4.25 Gbps, as demonstrated by 4 Gbps Fibre Channel transceivers. Extending this to 5 Gbps may be possible with some minor modifications such as increasing the bandwidth of the laser driver and receiver amplifier, although this may result in decreased receiver sensitivity. For embodiments where only two links are channelized, the transceiver may only need to operate at data rates greater than 2 Gbps. Vendors of synchronous optical network (SONET) optical carrier 48 (OC-48) connections already offer this capability at 2.488 Gbps.

In theory, it may be a simple matter to extend the idea of multiple GbE signals being interleaved or encoded onto a single, higher bandwidth fiber optic link by overclocking the physical layer elements as described herein to interleaving or encoding multiple 10 gigabit Ethernet (10 GbE) signals. Presently, however, running a 10 Gbps transceiver at higher rates is not trivial, especially to achieve speeds at least double the 10 Gbps rate in an effort to combine at least two links. Once optical transceivers are capable of operating at speeds greater than 20 Gbps, embodiments of the invention may certainly apply to multiple 10 GbE signals, as well. Although it should now be understood that embodiments of the invention may apply to 10 GbE, this description will henceforth only focus on multiple 1 gigabit Ethernet signals for clarity.

To achieve the increased data rate with GbE signals, the PHY ICs 108 may overclock the optical transceivers 106 at 1, 2 or 4 Gbps and digitally sample and multiplex the 1000Base-FX links 102 in an effort to achieve an equivalent data rate of 1 Gbps for each link 102. For some embodiments, if four links 102 are being channelized as depicted in FIG. 1, then the transmitting PHY IC 108 may overclock the optical transceiver 106 at or over 4 Gbps.

Since the optical transceiver 106 may be expecting a new bit at four times the frequency, four 1000Base-FX links 102 can be sampled and multiplexed at the same 4 Gbps clock rate by the PHY IC 108 in an effort to achieve an equivalent data rate of 1 Gbps for each link 102. For some other embodiments, two links 102 may be channelized onto a single optical fiber link 104 by overclocking the optical transceiver 106 at 2 Gbps while sampling and multiplexing two 1000Base-FX links 102 within the PHY IC 108. Still, some other embodiments may overclock the optical transceivers 106 in an effort to simply achieve greater bandwidth of 2 or 4 Gbps for a single 1000Base-FX link, a sort of non-standardized 2 GbE or 4 GbE.

Beyond the physical link layer 112, communication may occur as normal, so embodiments of the invention may be transparent to the data link layer 114 and other higher network layers in the OSI model. Of course, PHY ICs 108 modified according to the invention may be designed with the capability to return to the conventional clock rate and operate as conventional 1000Base-FX PHY ICs. This may avoid having to manufacture and support two different 1000Base-FX PHY ICs and could accommodate backwards compatibility.

Figure 2:
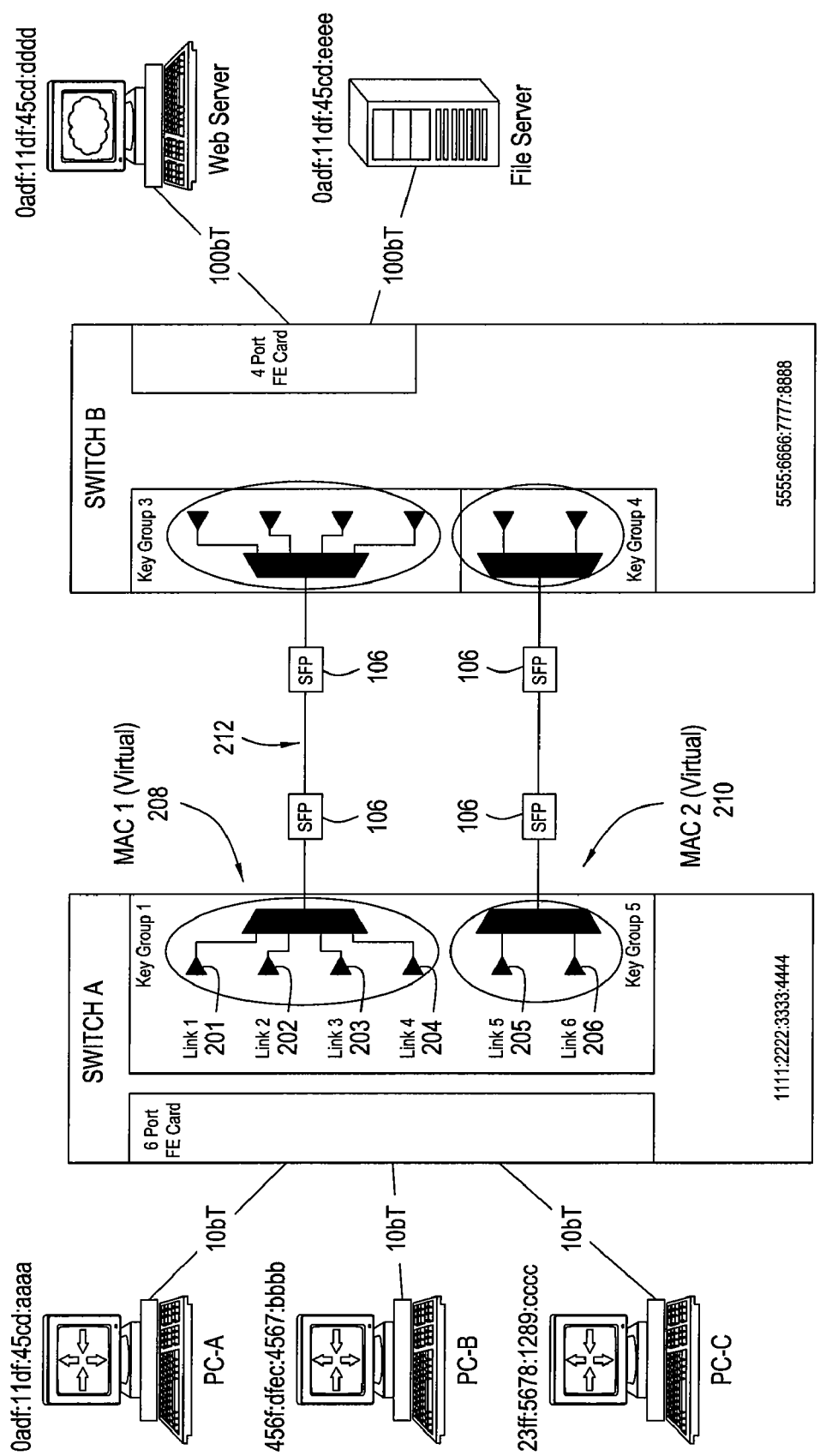
FIG. 2 is a block diagram of link aggregation using a virtual media access control (MAC) address according to embodiments of the invention.

At the data link layer 114, multiple channelized 1000Base-FX links 102 may be treated as separate GbE signals and may be given separate MAC addresses according to existing MAC standards. Since state-of-the-art network ICs can typically process up to 24 GbE signals anyway, no additional burden may be placed upon the network IC. Referring to FIG. 2, for such embodiments of the invention, four 1000Base-FX links (e.g. Link 1 201, Link 2 202, Link 3 203, and Link 4 204) may be channelized and carried on the same optic link 212. All four links 201, 202, 203, 204 may be granted a different MAC addresses.

However, the idea of increased port density through aggregation may be carried further into the data link layer 114 along the guidelines of the Institute of Electrical and Electronics Engineers (IEEE) 802.3ad standard for link aggregation. For some embodiments, the channelized 1000Base-FX links 102 may be considered as a single link with a virtual MAC address. FIG. 2 illustrates this link aggregation. In such embodiments, all four links 201, 202, 203, 204 may be aggregated to share the same virtual MAC address, MAC 1 208 in FIG. 2.

For embodiments of the invention where two links are channelized, the two links (e.g. Link 5 205 and Link 6 206) may be given separate MAC addresses, or they may share the same virtual MAC address, MAC 2 210. The aggregation of links to share a virtual MAC address may not be limited to channelized links as long as the aggregated links are communicating between the same devices.

Methods of Channelization

Figure 3:
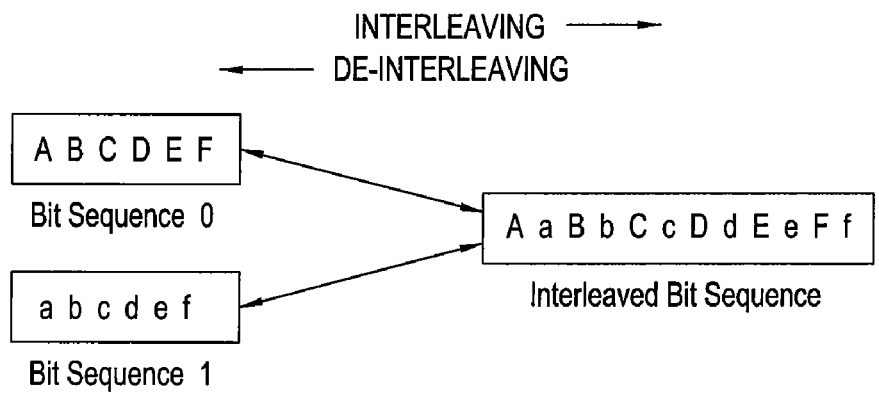
FIG. 3 is a prior art functional diagram of bit interleaving/de-interleaving.
Figure 4:
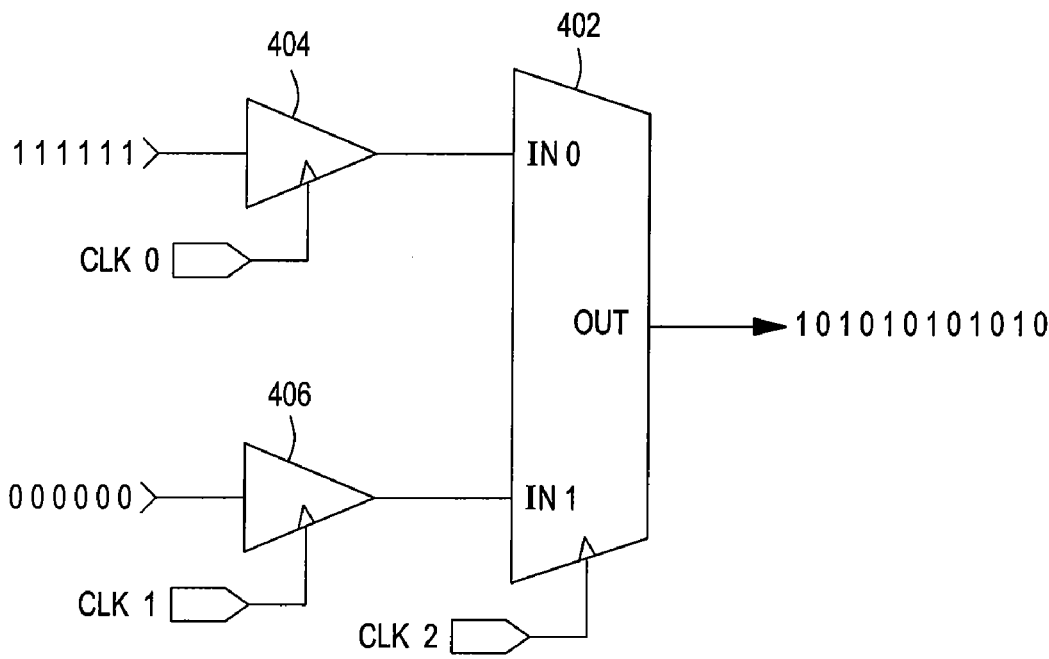
FIG. 4 is a block diagram for interleaving two 1000Base-FX links to create a single fiber optic link according to one embodiment of the invention.
Figure 4:
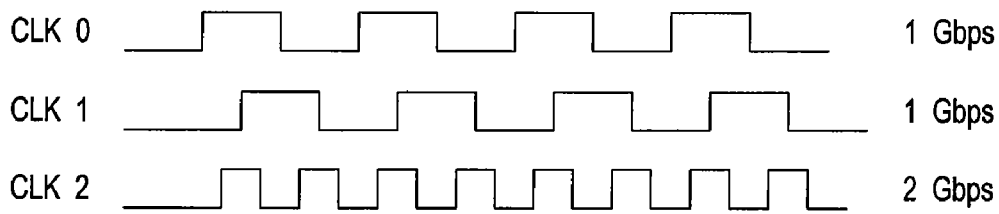

Since the channelized 1000Base-FX links 102 share a single optic link 104, the links 102 must be traveling to the same location. Therefore, the PHY IC 108 may simply interleave the steady synchronous stream of bits as it is multiplexing the links at the overclocked rate before transmission. Interleaving is a straightforward method of merging data by alternately interspersing the bits as shown in FIG. 3. Interleaving two 1000Base-FX links is illustrated in FIG. 4 according to some embodiments of the invention where a multiplexer 402 may be clocked at 2 Gbps while two transceivers 404, 406 may be clocked at 1 Gbps and 180° out of phase. The interleaving order may not matter as the data link layer 114 may treat the de-interleaved bits as independent links at the receiving end. For some embodiments, bit interleaving may be suitably supported by EtherChannel, a technology allowing link aggregation and traffic management for effective bandwidths greater than what could be achieved by a single link.

However, there may be some instances where the network developer needs to be able to keep track of the order in which data packets of the aggregated links will be sent to different MAC addresses. One example of this may be when internet routing protocols, such as the Open Shortest Path First (OSPF) protocol, pass packets between connected routers. These internet routing protocols may identify that there are multiple (e.g. two or four, according to some embodiments) identical links connecting two routers and the routers will try to manage these identical links based upon the administrative rules set by the network developer. A particular router may turn off all but one path to avoid routing loops. It may also set one path to conduct 90% traffic and another to conduct 10%. Ideally, the user should know when concatenated links at the physical layer may exist and can set administrative rules to evenly share traffic among redundant links.

Without a suitable method of keeping track of the transmission order (e.g. using a tag), if an error or bit loss occurs anywhere, a data packet from a certain sending MAC address may travel to a different random receiving MAC address of the multiple concatenated links. There could now be a mismatch in the MAC address table. If another router requests where a packet came from, the router with the incorrect MAC address table may report the wrong location. In the simplest cases, no serious errors or problems may occur. However, in a real network with a myriad of ports, MAC address tables, and routers distributed over distances, serious issues may arise as MAC address tables that were once correct are sent, overwritten with incorrect data, resent, and then corrected again, etc. Internet routing protocols are not typically built to handle this kind of corruption.

A refresh cycle may allow the bit interleaving to relearn the original MAC addresses for the individual links that the architecture first started communicating with. However, the refresh cycle may take anywhere from 15 seconds to as long as 30 minutes. At such high data transmission frequencies, such long refresh cycles may allow too many communication errors. In such cases, embodiments of the invention may incorporate some kind of encoding such as tagging the data packets based on which 1000Base-FX link 102 the data originated from. In this manner, the architecture should know the correct MAC address to send the de-interleaved data packet.

As mentioned above, the PHY IC 108 may add a tag consisting of one or more bits to the channelized link 110 as it is multiplexing the individual links 102. In this case, the PHY IC 108 may need to be clocked slightly faster than the 1, 2, or 4 Gbps data rate to account for the extra bits in the tag. For some embodiments, unused portions of the transmission, such as unused portions of the Ethernet header, may be used to convey a tag thereby circumventing the need for the PHY IC 108 to be clocked faster than 1, 2 or 4 Gbps. In any event, any type of suitable tagging may prevent the need for developing a new GbE MAC standard.

For some embodiments, a streamlined protocol from Cisco called Converged Data Link (CDL) may be employed as the simplest form of tagging. CDL has a two-bit preamble already located in the Ethernet header that may be used to tag up to 64 links. Since many components at the data link layer 114 may have preamble write capability, such embodiments may simply tag and un-tag the data packets using the preamble at the start and end of the physical link, respectively. The CDL information may be stripped from the Ethernet header after it is read, so higher network layers should be oblivious to the tagging. Even if a tagged data packet is sent to a non-CDL-compatible device, such a device should ignore the preamble being used for a tag. Other embodiments may use Generic Framing Procedure (GFP) protocols to tag the individual data packets from the 1000Base-FX links 102 and be able to determine from which link 102 the data originated.

Auto-Negotiation

With network communications, different devices (e.g. switches, hubs, and linecards) may be capable of transmitting information at different link speeds. Auto-negotiation is a process of sensing the transmission speed of two different devices and selecting the maximum speed that can accommodate both devices. To maintain backwards compatibility with legacy 1000Base-FX links, the current Ethernet auto-negotiation methods may be extended to detect whether an endpoint connected to a network interface card (NIC) is compatible with multiple channelized 1000Base-FX. Occurring at the physical layer of the Open Systems Interconnection Reference Model (OSI Model), auto-negotiation involves trying to communicate at the highest selection level or speed, and when that communication fails, moving down to the next selection level until a compatible selection level is negotiated.

Hence, auto-negotiation for multiple channelized 1000Base-FX may be accomplished by overclocking the conventional 1000Base-FX, which communicates with a data rate of 1 Gbps, at 4 Gbps (or slightly higher to account for the tagging bits). This overclocked scheme may be given a new selection level in an auto-negotiation table. If this communication works, then a 4-link channelized 1000Base-FX connection according to embodiments of the invention may be present. If this overclocked communication fails, then overclocking the conventional 1000Base-FX at 2 Gbps or slightly higher may be attempted.

Overclocking at 2 Gbps may also be given a new, but separate selection level in an auto-negotiation table. If this communication works, then a 2-link channelized 1000Base-FX connection according to embodiments of the invention may be present. If the overclocked communication fails, then the parameters for the next lowest selection level may be attempted. This process may be repeated using the parameters for auto-negotiation at the attempted selection level until a compatible selection level is negotiated.

Some embodiments of the multiple 1000Base-FX channelized link architecture may be user-programmable. In such cases where a single 1000Base-FX link is connected over a single fiber optic cable, the user may operate at a typical 1 Gbps. When the user determines that he or she wants to run this link faster, the user may select the 2 Gbps or 4 Gbps speeds. For some user-programmable embodiments, the user may even be able to select the type of encoding desired, even if this includes simple bit interleaving with no encoding.

Within the current optic GbE structure of 1000Base-FX, embodiments of the invention may only require changes to the optical transceivers 106, the PHY ICs 108 and software within switching and routing products at the physical layer 112. Among other things, these changes may include overclocking the optical transceivers 106 at rates greater than or equal to 1 Gbps, 2 Gbps, or 4 Gbps and providing a means to accept, sample, and multiplex multiple 1000Base-FX links.

For some embodiments, the PHY ICs 108 may need to be changed to perform simple bit interleaving, tagging, or other encoding of the data packets from individual links 102. For some embodiments, the optical transceivers 106 may need to be modified to be capable of communicating data at a rate greater than or equal to 4 Gbps. No changes to optic cables, MAC addresses or network processors should be required. The multiple channelized 1000Base-FX architecture should function within the boundaries of existing IEEE 802.3 standards, so there should also not be a need to define a new standard. Furthermore, auto-negotiation should guarantee backwards compatibility with conventional 1000Base-FX links.

While the foregoing is directed to embodiments of the present invention, other and further embodiments of the invention may be devised without departing from the basic scope thereof, and the scope thereof is determined by the claims that follow.

The invention claimed is:
1. An apparatus, comprising:
   a connector for providing a network connection via cabling utilizing optical fibers; and
   an interface device coupled to the connector and configured to multiplex at least two communications links, each capable of transmitting data at a rate of at least 1 gigabit per second (Gbps), into a single communications link having a bit rate of at least 2 Gbps established over one or more of the optical fibers, wherein the interface device is configured to aggregate the at least two communication links with a single virtual media access control (MAC) address not belonging to any of the at least two communication links, and wherein the interface device is further configured to tag data received over the at least two communications links to indicate which of the at least two communication links the data originated from.

2. The apparatus of claim 1, wherein the at least two communications links comprises at least four communications links such that the interface device is configured to multiplex the at least four communications links, each capable of transmitting data at a rate of at least 1 gigabit per second (Gbps), into a single communications link having a bit rate of at least 4 Gbps established over one or more of the optical fibers.

3. The apparatus of claim 1, wherein the connector comprises a miniature fiber optic cable connector that uses a push-pull mechanism.

4. The apparatus of claim 1, wherein the interface device is configured to add a tag comprising at least one bit to the single communication link.

5. The apparatus of claim 1, wherein the interface device comprises a multiplexer having a clock rate of at least 2 Gbps.

6. The apparatus of claim 1, wherein bits from the at least two communications links are interleaved to form the single communications link.

7. The apparatus of claim 1, wherein the interface device is further configured to separate a single combined communications link having a bit rate of at least 2 gigabits per second (Gbps) into at least two communications links, each having a bit rate of at least 1 Gbps.

8. A method of transferring data over a network connection utilizing optical fibers, comprising:

combining at least two communications links, each having a bit rate of at least 1gigabit per second (Gbps), into a single communications link having a bit rate of at least 2 Gbps established over one or more of the optical fibers, wherein combining the at least two communications links comprises interleaving bits of the at least two links, and further comprises tagging data received over the at least two communications links with one or more bits to indicate which of the at least two communication links the data originated from.

9. A method of transferring data over a network connection utilizing optical fibers, comprising:

receiving data over at least two devices for transmitting at least two communications links, each possessing a bit rate of at least 1 gigabit per second (Gbps) and each connected to a combining device;

clocking the combining device at a clock rate of at least 2 Gbps; and combining the at least two communications links into a single communications link having a bit rate of at least 2 Gbps established over one or more of the optical fibers, wherein combining the at least two communication links comprises interleaving bits received from the at least two devices, and further comprises tagging data received over the at least two communications links with one or more bits to indicate which of the at least two communication links the data originated from.

10. The method of claim 9, wherein the combining device is a multiplexer.

11. The method of claim 9, wherein combining the at least two communications links comprises switching between the at least two communications links at the clock rate.

12. A method of transferring data over a network connection utilizing optical fibers, comprising:

establishing at least one combined communications link representative of at least two communications links, each having a bit rate of at least 1 gigabit per second (Gbps), wherein the combined communications link is assigned a single virtual media access control (MAC) address not belonging to any of the at least two communication links, and wherein data frames received over combined communication link are tagged to indicate which of the at least two communication links each data frame originated from;

adding a selection level corresponding to the combined link to an auto-negotiation table comprising at least a highest selection level and at least one lower selection level ranked according to data transfer rates, wherein the highest selection level corresponds to a data transfer rate of at least 2 Gbps;

choosing the highest selection level as a trial selection level; and trying to communicate across the combined link at the trial selection level.

13. The method of claim 12, further comprising:

choosing the next lower selection level as the trial selection level if communicating fails at the highest selection level.

14. The method of claim 12, further comprising:

iteratively choosing lower selection levels and trying to communicate across the combined link until communicating works.

* * * * *